United States Patent
Vigoda et al.

(10) Patent No.: US 8,674,868 B2
(45) Date of Patent: Mar. 18, 2014

(54) SIGNAL CONVERSION

(75) Inventors: Benjamin Vigoda, Winchester, MA (US); Jeffrey Bernstein, Middleton, MA (US); Martin McCormick, Boston, MA (US)

(73) Assignee: Analog Devices, Inc., Norwood, MA (US)

( * ) Notice: Subject to any disclaimer, the term of this patent is extended or adjusted under 35 U.S.C. 154(b) by 32 days.

(21) Appl. No.: 13/492,118

(22) Filed: Jun. 8, 2012

(65) Prior Publication Data

US 2012/0313802 A1 Dec. 13, 2012

Related U.S. Application Data

(60) Provisional application No. 61/494,783, filed on Jun. 8, 2011.

(51) Int. Cl.
*H03M 1/12* (2006.01)
(52) U.S. Cl.
USPC .......................................... 341/155; 702/179
(58) Field of Classification Search
USPC ........................................................ 341/155
See application file for complete search history.

(56) References Cited

U.S. PATENT DOCUMENTS

| | | | |
|---|---|---|---|
| 6,894,632 B1* | 5/2005 | Robinson | 341/143 |
| 2009/0267821 A1* | 10/2009 | Chmelar et al. | 341/159 |

FOREIGN PATENT DOCUMENTS

JP 2008084393 A * 4/2008

OTHER PUBLICATIONS

De Vito et al., An Improved ADC Error Correction Scheme Based on a Bayesian Approach, IEEE, IMTC 2005—Instrumentation and Measurement Technology Conference Ottawa, Canada, May 17-19, 2005, pp. 160-164.*
Giaquinto et al., Testing and Optimizing ADC Performance: A Probabilistic Approach, IEEE Transactions on Instrumentation and Measurement, vol. 45, No. 2, Apr. 1996, pp. 621-626.*
Hein et al., New Properties of Sigma-Delta Modulators with dc Inputs, IEEE Transactions on Communications, vol. 40, No. 8, Aug. 1992 pp. 1375-1387.*
Thao et al., Deterministic Analysis of Oversampled AD Conversion and Decoding Improvement Based on Consistent Estimates, IEEE Transactions on Signal Processing, vol. 42, No. 3, Mar. 1994 pp. 519-531.*

* cited by examiner

*Primary Examiner* — Howard Williams
(74) *Attorney, Agent, or Firm* — Occhiuti & Rohlicek LLP

(57) ABSTRACT

An approach to signal conversion adapts the signal conversion process, for example, by adapting or configuring signal conversion circuitry, according to inferred characteristics (e.g., probability distribution of value) of a signal being converted. As an example, an analog-to-digital converter (ADC) may be adapted so that its accuracy varies across the range of possible input signal values in such a way that on average the digital signal provides a higher accuracy than had the accuracy remained fixed. In another example, models (and corresponding inference circuitry) of both an input signal process and of a quantization process are used to improve signal conversion accuracy.

14 Claims, 6 Drawing Sheets

SIGNAL CONVERSION

CROSS-REFERENCE TO RELATED APPLICATIONS

This application claims the benefit of U.S. Provisional Application No. 61/494,783, filed on Jun. 8, 2011, which is incorporated herein by reference.

BACKGROUND

This document relates to signal conversion.

A/D converters are devices which convert continuous analog values into a discrete time, digital representation. Some of the most commonly used conventional A/D converters are Flash A/D converters, successive approximation A/D converters, and Sigma-Delta A/D converters. Such A/D converters generally implement a fixed architecture which is designed to work in a broad number of scenarios. The result of using such architectures can be sub-optimal performance in certain scenarios.

For example, using a Flash A/D converter to quantize a signal which does not utilize the full dynamic range of the A/D converter can under-utilize the resolution of the A/D converter. This is due to the architecture of the Flash A/D converter. In particular, Flash A/D converters quantize samples by generating a thermometer code by comparing an analog signal level to a number of fixed reference levels. If there are 255 fixed reference levels and the analog signal levels only vary between reference levels 200 and 250, the result of comparing the other reference levels (i.e., 1-199 and 251-255) to the analog signal level is likely the same from sample to sample.

Sigma-Delta A/D converters generally processes an analog input signal to produce a bit-stream (i.e., a one-bit resolution discrete time signal) that is then digitally filtered and decimated to yield a desired digitized (i.e., multibit discrete time) representation of the input. One form of digital filtering used with Sigma-Delta converters is linear low-pass filtering. A number of techniques have applied non-linear filtering techniques to the bitstream output of an Sigma-Delta converter.

The first is the Zoomer algorithm [S. Hein and A. Zakhor, "New properties of Sigma Delta modulators with DC inputs," IEEE Transactions on Communications, volume 40, number 8, pp. 1375-1387, August 1992.] Generally, this algorithm assumes a constant input signal and seeks to determine its value by using the bitstream to form upper and lower bounds on the signal that become consistently tighter. This method can performs poorly when the input is not exactly constant (for example, small amounts of additive noise). As few signals are exactly constant and noise free, the Zoomer algorithm is rarely used in practice.

Bandlimited inputs can be nonlinearly decoded from a sigma-delta bitstream using the algorithms of Thao and Vetterly [N. T. Thao and M. Vetterli, "Deterministic analysis of oversampled A/D conversion and decoding improvement based on consistent estimates," IEEE Transactions on Signal Processing, Volume 42, Issue 3, pp. 519-531, March 1994.]. In this case, alternating projections are used to recover the input by alternating the enforcement of the bandlimited constraint and a constraint that it be consistent with the observed sigma-delta bitstream. The computational complexity of such reconstruction is moderate.

A general reference for known nonlinear decoders is: "Sigma Delta modulators: nonlinear decoding algorithms and stability analysis" by Søren Hein, Avideh Zakhor.

SUMMARY

In one aspect, in general, an approach to signal conversion adapts signal conversion (e.g., adapting or configuring signal conversion circuitry) according to inferred characteristics (e.g., probability distribution of value) of a signal being converted. As an example, an analog-to-digital converter (ADC) may be adapted so that its accuracy varies across the range of possible input signal values in such a way that on average the digital signal provides a higher accuracy than had the accuracy remained fixed.

In another aspect, in general, an approach to signal conversion adapts a transformation stage to transform a signal being converted. In some examples, the transformation is adapted according to inferred characteristics (e.g., a predicted probability distribution of value based on a model of the signal evolution) of the signal being converted. In some examples, the output of the transformation stage is provided to an ADC.

In another aspect, in general, an approach to signal conversion both adapts a transformation stage and an ADC stage.

In another aspect, in general, a signal converter is configured to accept a sequence of analog input samples $z_t$ and provide as output a corresponding sequence of digitized values $x_t$ respresenting the input samples based on quantizer outputs $y_t$. The converter includes first circuitry configured perform a statistical inference relating quantizer outputs $y_t$ and digitized values $x_t$ according to a model of a quantization process that generates the quantizer outputs $y_t$ from the analog input samples $z_t$. The converter also includes second circuitry configured perform a statistical inference on the sequence of digitized values $x_t$ according to a model of a signal generation for the analog input samples $z_t$. Quantization circuitry in the converter is configured for processing the analog input samples $z_t$ to produce the quantizer outputs $y_t$. The quantizer outputs $y_t$ are coupled to the second circuitry, and the first circuitry is coupled to the first circuitry such that in operation, the converter provides the sequence of digitized values $x_t$ to represent the analog input samples $z_t$ according to the model of the signal generation process.

In some examples, the first circuitry and the second circuitry each implement a factor graph based inference procedure. In some examples, the circuitry has a structure that corresponds to a structure of a factor graph, while in other examples, a processor, for example as described in U.S. patent application Ser. No. 13/491,212 (filed Jun. 7, 2012, and incorporated herein by reference) is used to implement the factor graph based inference procedure.

The quantizer outputs $y_t$ may be represented with fewer bits of precision than the digitized values $x_t$. For example, the quantizer outputs $y_t$ are represented with one bit of precision.

The quantization circuitry may include an adaptive quantizer configured to adapt according to characteristics of the sequence of input samples $z_t$.

Other general aspects include the following:

A converter that uses statistical machine learning or inference techniques to model a signal so that it can optimize a quantizer for that signal.

A converter that uses statistical machine learning or inference techniques to model a signal so that it can optimize a linear or nonlinear projection or compression of the signal.

A converter that uses statistical machine learning or inference techniques to model a signal so that it can remove noise from that signal.

A converter that uses statistical machine learning or inference techniques to model a signal so that it can predict the signal and thereby better control a programmable gain.

A converter that uses statistical machine learning or inference techniques to model a signal so that with low latency, it can remove an interferer.

A converter that uses statistical machine learning or inference techniques to model a signal so that it can separate sources and model and convert each one better.

A converter that uses statistical machine learning or inference techniques to model a signal so that it can identify a signal (and then react).

A converter that uses statistical machine learning or inference techniques to model a signal so that it can subtract the signal from other signals.

A converter that uses statistical machine learning or inference techniques to model a signal so that it can divide away the signal from other signals.

A converter that uses statistical machine learning or inference techniques to model a signal so that it can remove the signal from other signals.

A converter that uses statistical machine learning or inference techniques to model a signal so that it can remove the other signals from the signal.

A converter that uses statistical machine learning or inference techniques to model a signal so that it can repair loss of the signal due to events such as, without limitation, clipping, partial or full erasures by the channel.

A converter that uses statistical machine learning or inference techniques to model its front-end circuits so that it can repair loss of the signal due to events such as, without limitation, clipping, offsets, partial or full erasures by the channel.

A converter that uses statistical machine learning or inference techniques to model its front-end analog mixed-signal circuits so that it can repair loss of the signal due to events such as, without limitation, clipping, offsets, partial or full erasures by the front-end.

Other features and advantages of the invention are apparent from the following description, and from the claims.

DESCRIPTION

In one embodiment, a signal conversion system includes machine learning and/or inference functionality. Some examples of such systems are A/D or D/A converters or signal transformations such as FIR filters or auto-rangers used to precondition a signal before A/D conversion.

Figure 1:
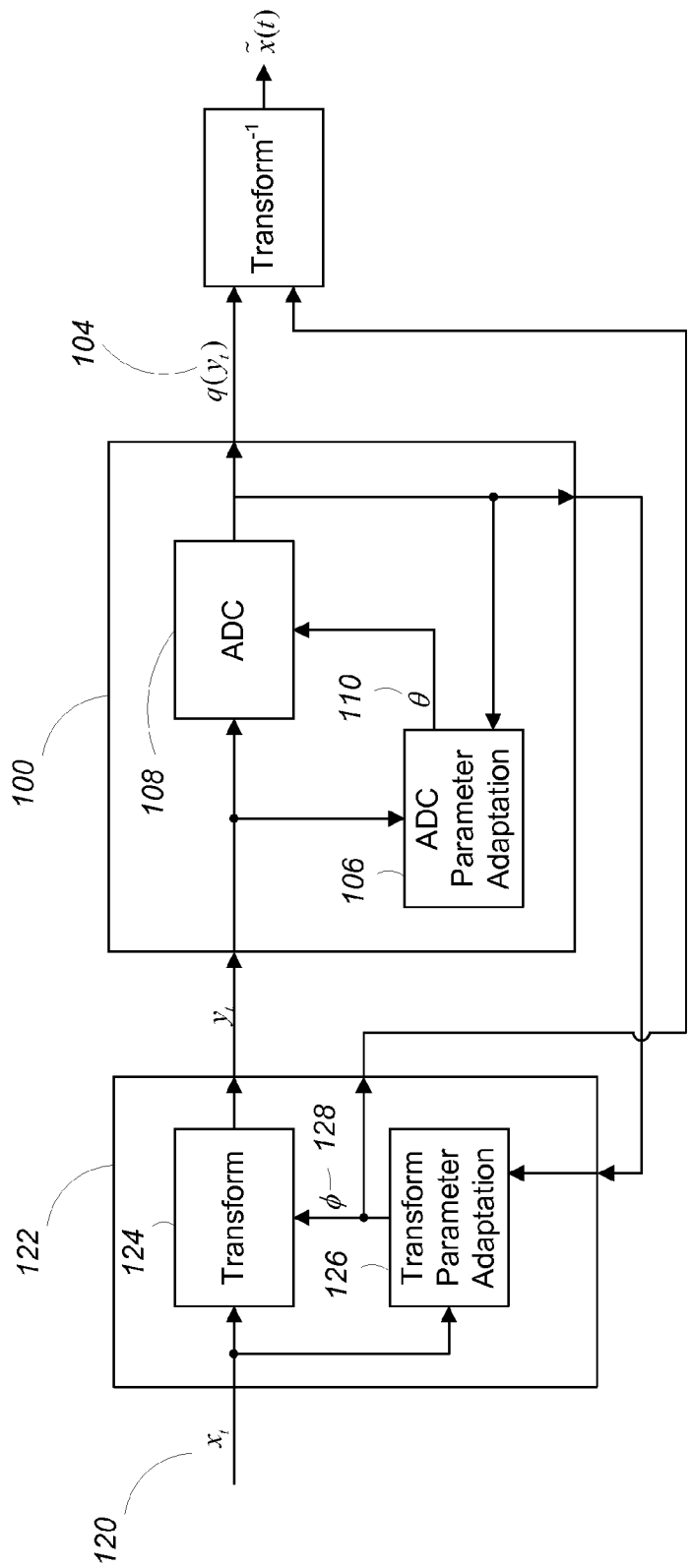
FIG. 1 is a signal conversion system.

Referring to FIG. 1, an example of an adaptive A/D converter module 100 is configured to accept an analog input signal $y_t$ 102 (e.g., a scalar or vector) as input and produce a binary representation of a quantized version of $y_t$ 102, $q(y_t)$ 104 as output. The A/D converter module 100 includes an ADC module 108 which quantizes $y_t$ 102 according to a set of parameters $\theta$ 110. One example of a set of parameter values represents a set of ranges of signal value and corresponding binary values to be output when the input signal falling in a range.

The set of parameters $\theta$ 110 are computed by an ADC parameter adaptation module 106. The ADC parameter adaptation module 106 accepts as input the signal $y_t$ 102 and the quantized version of $y_t$ 102, $q(y_t)$ 104. In some examples, the inputs to the module 106 are used to estimate a probability distribution of the input signal $y_t$ 102. The estimated probability distribution is used to compute the parameters $\theta$ 110 such that the ADC module 108 quantizes the analog input $y_t$ 102, for example, in an optimal way to minimize a quantization error associated with the conversion. It is noted that the lines carrying data between modules in FIG. 1 (and all subsequent figures) can carry either scalar values or vector values.

Figure 2:
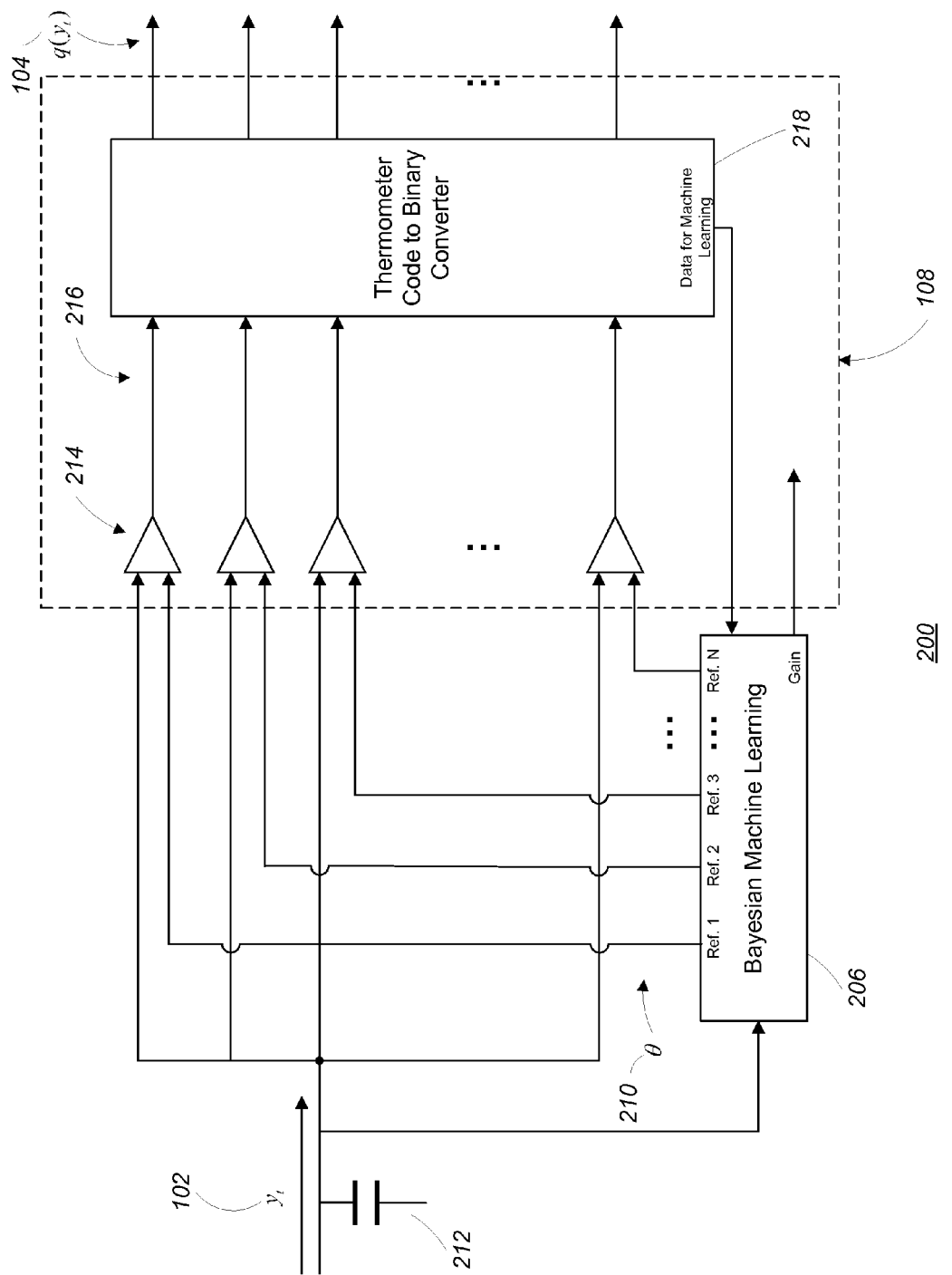
FIG. 2 is a Flash Analog to Digital Converter which uses machine learning.

Referring to FIG. 2, an example of an Adaptive Flash A/D converter is configured to adjust its comparator reference values 210 (i.e., parameters $\theta$ 110 of FIG. 1) using Bayesian machine learning such that they are better adapted to the distribution of the input signal $y_t$ 102. For example, the reference values can be adjusted based on a statistical distribution of past values of the input signal 102. This can provide a higher resolution quantization of the input analog signal in the area where the energy of the signal is present. Areas which lack signal energy are quantized at a lower resolution. The Adaptive Flash A/D converter architecture can adapt to the input signal resulting in a more optimally quantized input signal.

Figure 3:
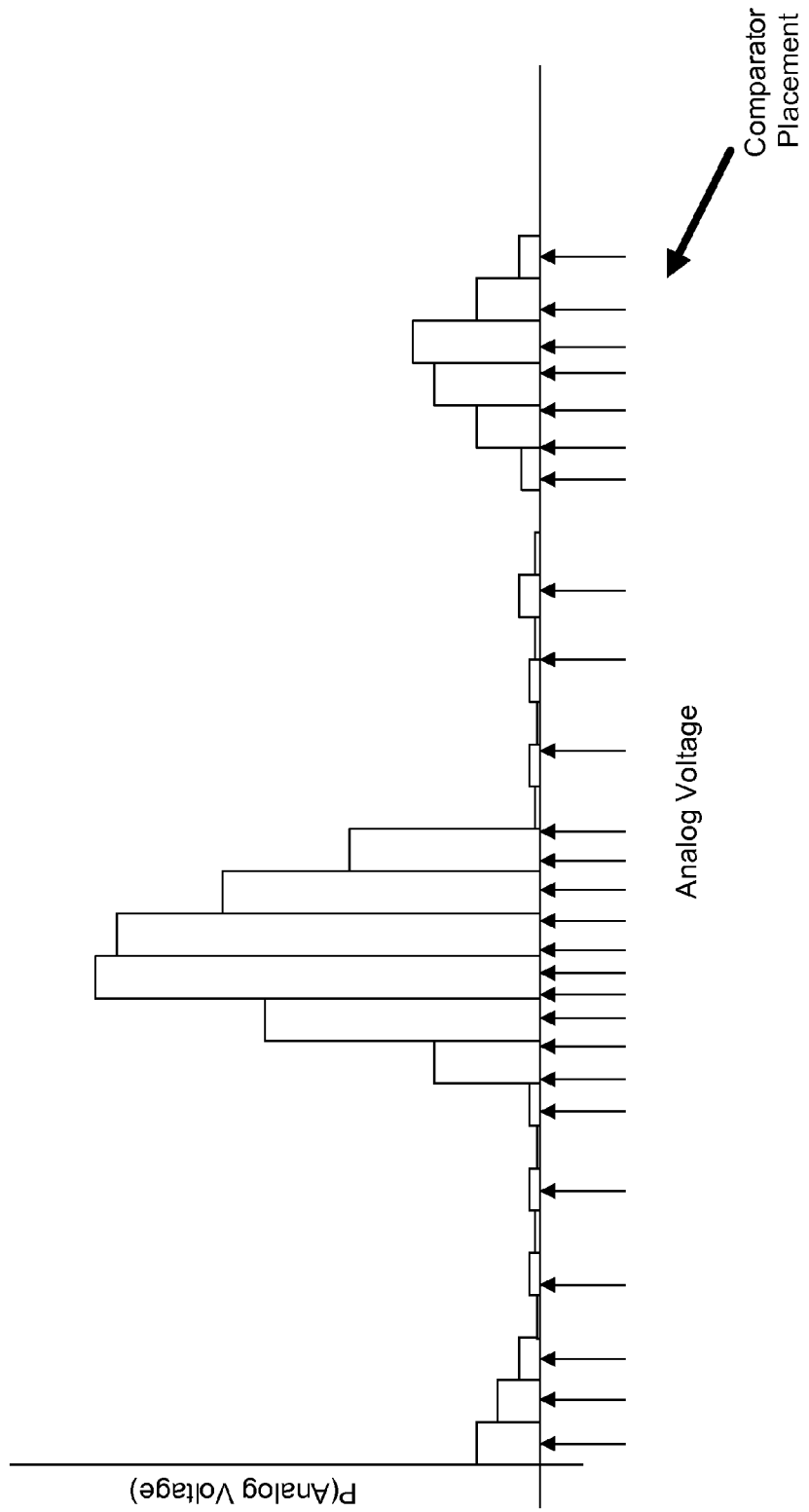
FIG. 3 is an illustration of comparator placement.

In some implementations, when an input sample is accepted by the A/D converter module 200, it is stored in a sample capacitor 212. In some examples, the analog level stored in the sample capacitor is passed to a number of comparators 214 and to a Bayesian machine learning module 206. The Bayesian machine learning module 206 adjusts the reference levels 210 of the comparators 214 based on the level of the sample and a statistical distribution of previously seen samples. Thus, the Bayesian machine learning module 206 can continuously adjust the reference levels 210 used by the comparators 214 such that they are concentrated in areas where the input signal level is most likely to be present as is illustrated in FIG. 3.

As a group, the outputs of the comparators 214 are known as a thermometer code 216. A conversion module 218 accepts the thermometer code 216 and converts it to a binary number which is the quantized version of $y_t$ 102, $q(y_t)$ 104.

This design can result in an A/D converter which yields more accurate quantization results, makes use of less comparators while maintaining the same quantization quality, and in some cases exceeds the effective number of bits (ENOB) of other A/D converters.

In some examples, the probability distribution of the input signal can be used to improve the binary search performed by a successive approximation A/D converter. In such examples, each search iteration of the A/D converter, the probability distribution can be updated based on the result of the last stage. This can result in more accurate quantization results.

In some examples, a particular type of Bayesian machine learning module, such as Expectation Maximization (EM) can be used to determine the probability distribution of the input signal 102.

In some examples, a particular type of Bayesian machine learning module, such as Belief Propagation on a factor graph can be used to determine the probability distribution of the input signal 102.

While the A/D converter described in FIG. 2 is a Flash A/D converter, machine learning can be used to adapt parameters of other types of A/D converters (e.g., Delta-Sigma, Successive Approximation, Pipelined, etc.) as well.

Again referring to FIG. 1, in some examples, a machine learning transformation module 122 can be used to transform a second input signal $x_t$ 120 before the signal 120 reaches the A/D conversion module 100. In particular, a transform module 124 accepts the second input signal 120 and transforms the signal 120 according to a set of transform parameters φ 128.

Figure 4:
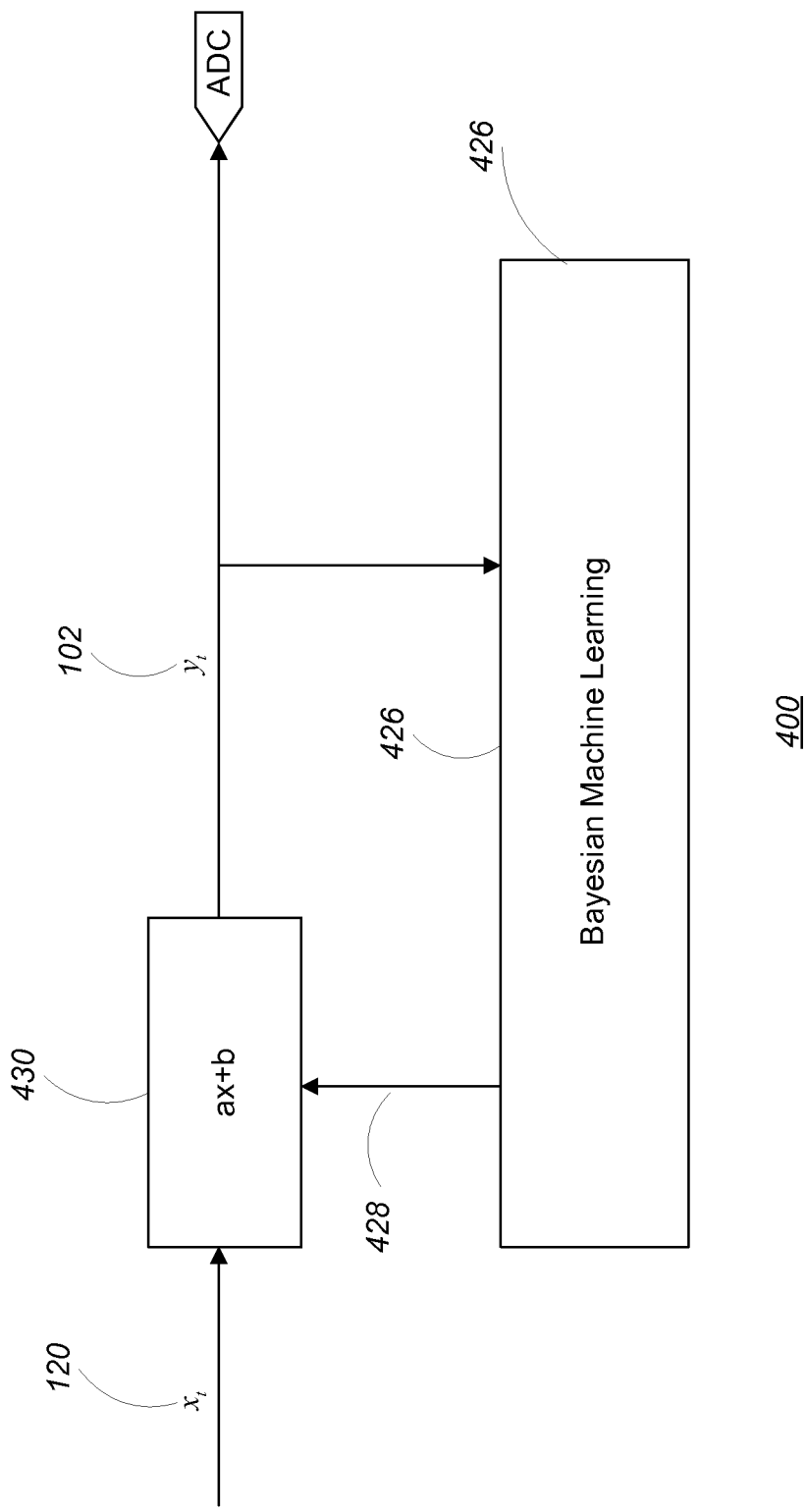
FIG. 4 is an example transformation which uses machine learning.

Referring to FIG. 4, one simple example of an adaptive transformation is an auto ranging transformation 400 which uses a Bayesian machine learning module 426 to adjust parameters 428 of a linear function 430 in order to optimize the dynamic range of an input signal $x_t$ 120 before quantization.

In particular, the input signal 120 is passed to a linear function module 430 where a linear function is applied to the signal 120, yielding the signal $y_t$ 102.

In some examples, the adjustable function is implemented using configurable charge sharing analog computation (e.g., U.S. Pat. No. 8,188,753, PCT Pub. WO2012/024507, U.S. patent application Ser. No. 13/490,110, which are each incorporated herein by reference). In some examples, the adjustable function is non-linear. In some examples, the signal $y_t$ 102 is not necessarily sent to an ADC (e.g., it is sent over a communications channel). In some examples, the transformation performs filtering, convolutions, projections, or other mathematical functions on the signal in the analog domain. In some examples, the parameters of the transformation are provided to a receiver of the quantized value in order for the receiver to reconstruct the signal value before transformation.

In yet other embodiments, statistical machine learning and/or inference functionality is added to A/D or D/A converters in order to improve their performance. (Hereafter for convenience we will refer only to A/D converters, but many of the same inventions or enhancements can be applied to D/A converters).

There are a number of different ways that machine learning techniques can enhance A/D converters. There are also a number of different A/D converter architectures that can be significantly enhanced, in addition to enabling some new architectures. The most common A/D converter architectures today are:

1. flash
2. pipelined
3. SAR
4. delta-sigma (also called sigma-delta)

Each of these architectures are described in numerous references. The ways to enhance an A/D converter using statistical machine learning techniques include without limitation:

1. linearization
2. improved converter "decoding"
3. modeling the signal

Linearizing analog mixed-signal circuits (Power Amplifiers, A/D converters, etc.) using Bayesian methods are described in co-pending applications (e.g., U.S. Provisional App. Nos. U.S. Ser. No. 61/374,937 and 61/429,922, and PCT Pub. WO2012/024507, which are incorporated herein by reference). Improved converter "decoding" (decoding, reconstruction, interpretation of the converted or partially converted signal) is also covered in other copending applications (e.g., PCT Pub. WO2011/085355, incorporated herein by reference). Here we will focus on the advantages in a converter of modeling the input signal.

Figure 5:
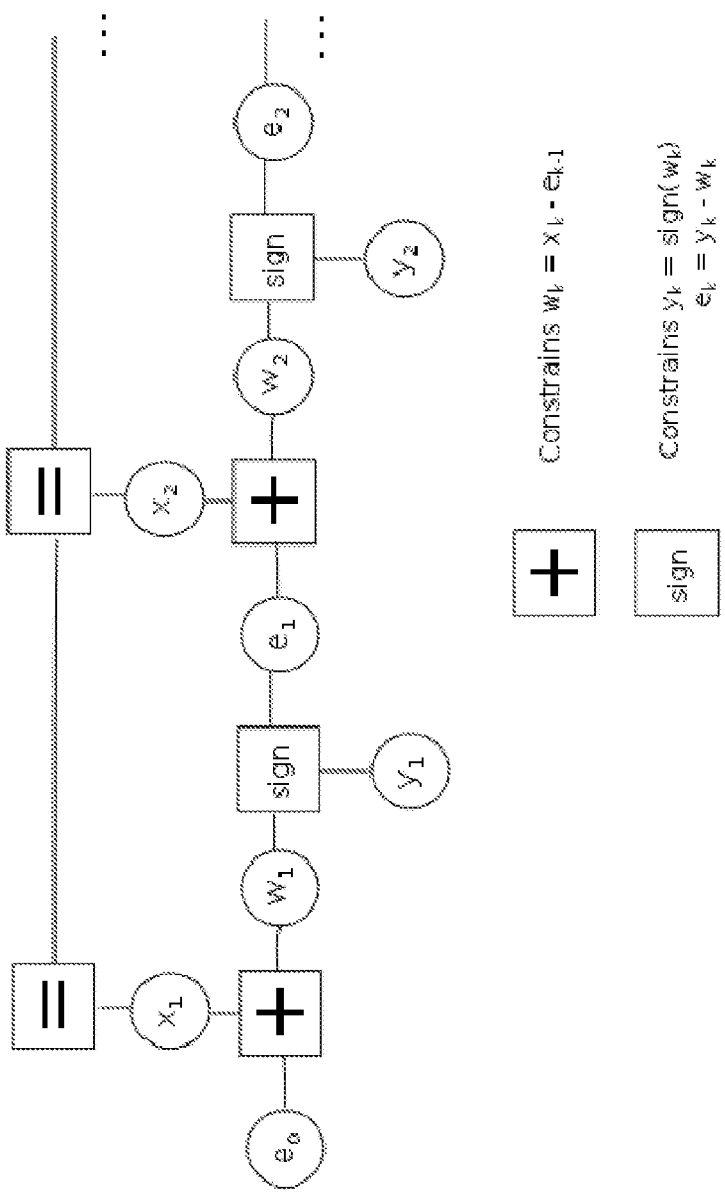
FIG. 5 is a sigma-delta factor graph.
Figure 6:
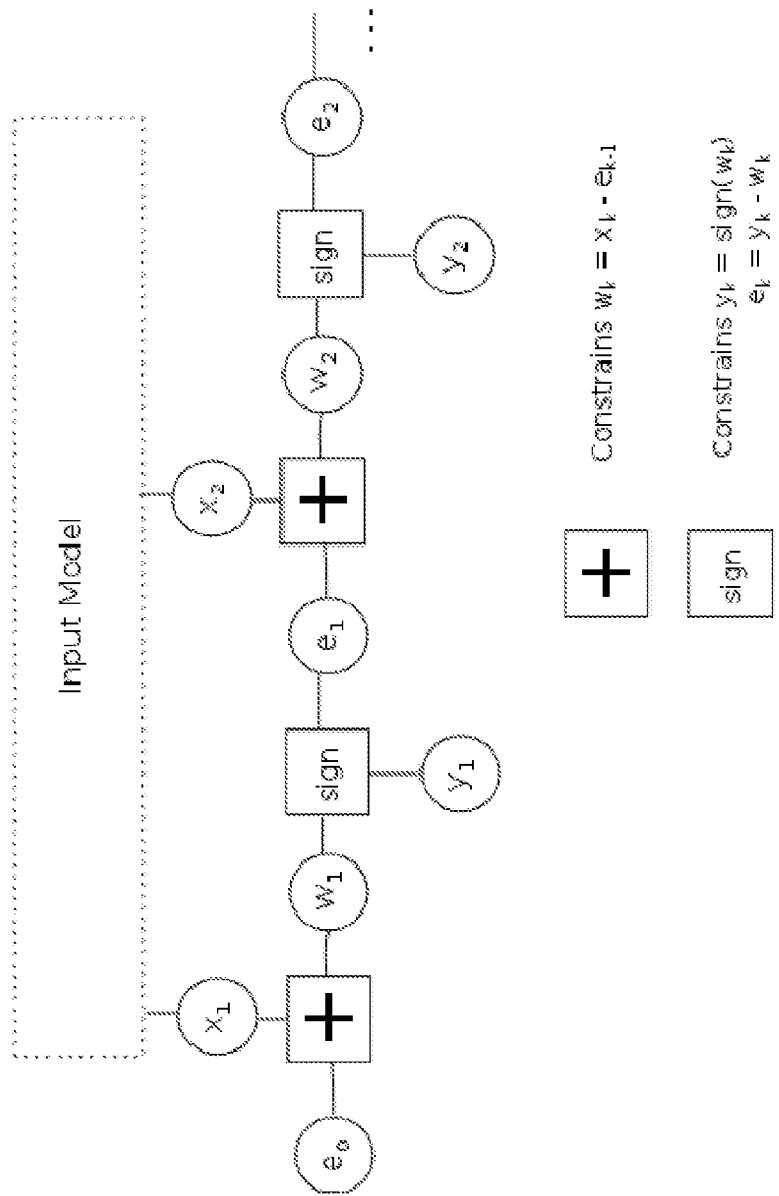
FIG. 6 is a sigma-delta factor graph with an input model.

Referring to FIGS. 5 and 6, in one embodiment, a Sigma-Delta ADC uses a factor graph and belief propagation to implement improved converter decoding. Sigma-delta converters have become a dominant ADC technology for their simple and robust design requiring little or no antialiasing filter while maintaining exceptional converter resolution.

Sigma-delta converter ADC's consist of an analog sigma delta modulator combined with a digital LPF. The modulator converts an input analog signal $z_t$ to a sequence of bits $y_t$ representing −1 and +1 called a bitstream. The difference between the bitstream and the analog input is called the quantization error. The sigma-delta modulator minimizes the PSD of this error within a certain frequency band (usually lower frequencies). This is ordinarily followed by a digital low-pass filter that takes linear combinations of these bits to form a PCM encoded version of the input (which is the goal of an ADC).

As an alternative to decoding the bitstream with a low-pass filter, a nonlinear decoder is possible. Such decoding can achieve 20-30 dB improvement in the resulting SQNR (signal to quantization noise ratio).

A class of nonlinear processing approaches is described below that differs from previous non-linear approaches, for example, as outlined in the Summary above. These approaches use of a factor graph and belief propagation to infer the input signal from an observed bitstream as a form of nonlinear decoding. This allows for the incorporation of more sophisticated models of the input (for example but not limited to bandlimited+noise, hidden Markov models, Gaussian mixture models or even nonparametric models, jump process, etc.).

The first example (FIG. 5) uses a model that is similar to that used in the Zoomer algorithm to show that the sum product algorithm on a specific "sigma-delta factor graph" can converge to estimates comparable to Zoomer. In one case, the input to the sigma-delta converter was 0.28 (plotted with o) and a bitstream of length 10 was used. Linear reconstruction gave an estimate of 0.20 while the Zoomer algorithm gave a range of 0.25 to 0.33 (plotted with x's). The sum-product on the sigma-delta factor graph with random scheduling and damping converges to a range similar to Zoomer with a maximum at 0.29.

More generally, any other factor graph can be connected to the sigma-delta factor graph to give an input model as shown in FIG. 6. The input model is essentially used to constrain the digital representations $x_t$ of the analog input $z_t$ according to a model of the time-evolution of the input. In one realization, the input model could be a linear state space model coupled with a Markov model of a digital transmitter. This would, for example, allow for improved reception in a digital mobile phone given (adaptive) knowledge of the transmitted sequence and the channel.

Additionally, the posterior distribution calculated by the factor graph for the values of inputs given the bitstream can be used to adapt the quantizer reference level of the sigma-delta quantizer (over a discrete or continuous range). This can improve the amount of information in each sample and thus reduce the entropy in the input posterior distribution—giving improved results in the input reconstruction.

Note than the above approach to use of a Sigma-Delta like structure can be generalized yet further in that one factor graph can be used to represent the quantization process, with unobserved variables $x_t$ and observed quantizer outputs $y_t$, and another factor graph can represent a model of the unobserved variables $x_t$. But the quantization process does not necessarily have to be of the one-bit oversampled variety. Alternatively, various forms of adaptive processing can be used to determine one-bit, or a limited numbers of bits per time sample, for example, using quantizer adaptation of the types described above, which may adapt threshold values for one or more comparators. Furthermore, expected characteristics of successive input samples $x_t$ can be used to determine the adaptation of the thresholds (or other mapping from an analog range to the one or limited number of bits output by the quantization process). Note that yet other layers of factor graphs or other modeling may be incorporated, for example, to explicitly model degradation (e.g., over a communication or acquisition channel such as additive Gaussian noise, shot noise in image processing, etc.) so that the inputs prior to degradation can be inferred by such an integrated process.

In addition, passive charge sharing technology described in copending applications (e.g., U.S. Ser. Nos. 13/490,110, 12/545,590, and 61/374,915, and 61/374,931, incorporated herein by reference) can be incorporated into the conversion process in order to perform basis convolutions, projections, or other mathematical functions on the signal in the analog domain in order to improve the ability to quantize or represent the signal. An example of this includes compressive sensing or linear basis projections using our TDF or FFT chips that are described in the copending applications and Appendix titled "Sparsity/Compressibility" of U.S. Ser. No. 61/494,783.

In another example, passive charge sharing technology can be incorporated into the conversion process to perform beam-forming in ultrasound applications. For example, an optimized sampling module (as shown in slide 13 of the Appendix titled "Ultrasound Trends" of U.S. Ser. No. 61/494,783) can precondition data in an ultrasound probe before digitization. The optimized sampling module may implement techniques such as compressed sensing, model based Bayesian reconstruction, or other enhancements to the signal before digitization. In other examples, the passive charge sharing technology can be used to perform simple, determinisitic beam forming operations (e.g., deterministically sweeping the beam over an area).

In other examples, passive charge sharing technology can implement a delay and sum beam-forming algorithm before digitization in an ultrasound probe using true FIR filters which include taps that can have values other than 0 or 1 (in contrast to conventional delay and sum beam-formers). The delay and sum beam-forming algorithm multiplies a collection of time samples of the signals from a collection of ultrasound transducers by a matrix. There is a "signal matrix" of ultrasound transducer signal samples in time and in space, and this matrix is multiplied by a beam-forming matrix using passive charge sharing technology.

When we discuss A/D converters, we have a more general view of what A/D conversion means. The conventional view is that an A/D converter is defined as a device that takes as input an analog signal with some limited dynamic range and outputs a Pulse Code Modulated (PCM) representation of the signal. A PCM representation is typically comprised of a binary number representing the amplitude of each successive sample that the A/D converts.

A more general definition of a converter is a device or system that takes as input an analog signal and outputs a more usable representation of the signal. A very simple generalization might be to use a different encoding for the output representation, for example a gray code instead of a binary code. But in general, the output of the converter could have many different kinds of representation such as PCM, sigma delta modulated, or any collection of sufficient statistics or parameters that describe the signal.

For example, in the most general case, a converter could be a device that takes as input the analog signal coming from an accelerometer and output just 1 bit of information: the car is crashing now or it is not crashing now. A contrarian might retort that this is simply akin to including a DSP in the A/D converter. DSP's are often paired with converters to post-process the output of the converter by applying filters, convolutions or other linear transforms to the PCM representation of the signal.

In a number of embodiments, the approach is different than that. In some embodiments, we use statistical machine learning and/or inference techniques that are capable of modeling and/or predicting and/or interpolating and/or etc. the signal. We then couple this capability closely with the converter in order to enhance its performance.

In many cases, this will take the form of what can be thought of as "feedback control" of converter front-end elements by the machine learning elements of the system. It may also take the form of "backward messages" in a factor graph. It may also take the form of post-processing by a statistical inference or machine learning technique of the signal representations created in or by the converter.

In some embodiments we process the signal in intermediate form before it is completely transformed to the PCM representation.

Modeling the Signal to Enable a Sub-Noise ADC:

If you can model a signal perfectly, you can build an extraordinary A/D converter that can actually output a perfect noiseless representation of the signal. If one were to write the data sheet for such an A/D converter, one could describe it as having an effective number of bits (ENoB) of infinity. Even if the signal was embedded in noise, with a perfect model of the signal that is able to perform maximum likelihood estimation of the signal, one could eventually output a representation of the signal that is noise free. We refer to this as a sub-noise ADC (our term). In practice, one would not achieve infinite ENoB, but one can out-perform existing A/D converters.

The sub-noise ADC is a compelling idea and can have many applications. A significant step further is to notice that if you can accept noise or other impairments to your measurement of a signal, but then apply a model of the signal in order to still output an accurate representation of the signal, then you might choose to lower the accuracy/resolution/complexity of your sampling/storage/quantization/projection front-end and then still do a good job of ultimately outputting a useful representation of the signal. In other words, you can make imperfect analog circuits in the front-end of the ADC, and then fix things up after the fact. Today's pipelined and SAR A/D converters perform a limited version of this when they do simple error correction across the outputs from each successive conversion stage, but the addition of statistical machine learning and inference techniques opens up radical new possibilities.

We will discuss these possibilities in the context of different traditional converter architectures. In the context of a flash ADC, it is about using fewer comparators or fewer samples in time while still accurately converting the signal. In the context of pipelined or SAR converters, the goal is similar, but the story is a bit more complicated and will be discussed below. In the context of sigma-delta converters we propose an approach (and its generalizations) that for convenience we call expectation-maximization-quantization (EMQ).

The goal is to have a simpler quantizer that is made up for with more powerful reconstruction. Use more course measurements with smarter reconstruction and control of the course measurements. Just like humans have limited sensory perception but we can still understand things about the world beyond the limits of our senses—think of cocktail party problem—prior model of the world helps you do more accurate sensing. Oscultate your eyes to the right part of the room.

But in general, the goal in all of these cases is to exceed the performance of today's A/D converters by exploiting statistical machine learning and/or inference to model the signal.

Expectation Maximization

A signal has a set of degrees of freedom over which it varies, for example, time, amplitude, space (perhaps pixels), etc. We will denote these independent variables by the vector $\vec{x}$. A probabilistic model of a signal is a probability distribution over those degrees of freedom, $p(\vec{x})$. This distribution models what the signal is likely and not likely to do.

A probabilistic graphical model or factor graph can approximate $p(\vec{x})$ by factoring it. One example of a factorization could be, for example, $p(x_1,x_2)p(x_2,x_3,x_4)p(x_3,x_4,x_5)$. More information on probabilistic graphical models are available in numerous references by authors including Loeliger and Jordan. Given samples of the signal and a factor graph model of the signal source, it is possible to estimate parameters of the signal source model using a number of different methods. In this section we will review one method called expectation-maximization.

We consider a factor graph that is a simple Gaussian mixture model $$P(\vec{x}) = \sum_{m=1}^{M} p(\vec{x}, c_m) \qquad (1)$$

$$= \sum_{m=1}^{M} p(\vec{x}|c_m)p(c_m)$$

$$= \sum_{m=1}^{M} \frac{|C_m^{-1}|^{1/2}}{(2\pi)^{D/2}} e^{-(\vec{x}-\vec{\mu}_m)^T C_m^{-1}(\vec{x}-\vec{\mu}_m)/2} p(c_m)$$

where $c_m$ is the mth Gaussian with parameters: mean $\vec{\mu}_m$ and covariance matrix $C_m$. The challenge is to find these parameters.

If we had a single Gaussian, the mean value $\vec{\mu}$ could be estimated by simply averaging the data, $$\vec{\mu} = \int_{-\infty}^{\infty} \vec{x} p(\vec{x}) d\vec{x} \approx \frac{1}{N} \sum_{n=1}^{N} \vec{x}_n. \qquad (2)$$

The second line follows because an integral over a density can be approximated by a sum over variables drawn from the density; we don't know the density but by definition it is the one our data set was taken from. This idea can be extended to more Gaussians by recognizing that the mth mean is the integral with respect to the conditional distribution, $$\vec{\mu} = \int \vec{x} p(\vec{x}|c_m) d\vec{x} \qquad (3)$$

$$= \int \vec{x} \frac{p(c_m|\vec{x})}{p(c_m)} p(\vec{x}) d\vec{x}$$

$$\approx \frac{1}{Np(c_m)} \sum_{n=1}^{N} \vec{x}_n p(c_m|\vec{x}_n).$$

Similarly, the covariance matrix could be found from $$C_m \approx \frac{1}{Np(c_m)} \sum_{n=1}^{N} (\vec{x}_n - \vec{\mu}_m)(\vec{x}_n - \vec{\mu}_m)^T p(c_m|\vec{x}_n), \qquad (4)$$

and the expansion weights by $$p(c_m) = \int \vec{x} p(\vec{x}, c_m) d\vec{x} \qquad (5)$$

$$= \int \vec{x} p(c_m|\vec{x}) p(\vec{x}) d\vec{x}$$

$$\approx \frac{1}{N} \sum_{n=1}^{N} p(c_m|\vec{x}_n).$$

But how do we find the posterior probability $p(c_m|\vec{x})$ used in these sums? By definition it is $$p(c_m|\vec{x}) = \frac{p(\vec{x}, c_m)}{p(\vec{x})} \qquad (6)$$

$$= \frac{p(\vec{x}|c_m)p(c_m)}{\sum_{m=1}^{M} p(\vec{x}|c_m)p(c_m)},$$

which we can calculate using the definition in equation??. This may appear to be circular reasoning, and it is! The probabilities of the points can be found if we know the probability distributions. Since we start knowing neither, we can start with a random guess for the parameters and go back and forth, iteratively updating the probabilities and then the parameters. Calculating an expected distribution given the parameters, then finding the most likely parameters given a distribution and it is guaranteed to converge to a locally optimal maximum likelihood distribution.

The way of understanding how this works is based on equation 6. The numerator measures how strongly one Gaussian models a point, and the denominator measures how strongly all the Gaussians model the point. The ratio gives the function of the point to be associated with each Gaussian. Each point has one unit of explanatory power, and it gives it out based on how well it is modeled. As a Gaussian begins to have a high probability at a point, that point effectively disappears from the other Gaussians. The Gaussians therefore start exploring the data set in parallel, "eating" points that they explain well and forcing the other Gaussians towards ones they don't. The interaction among Gaussian happens in the denominator of the posterior term, collectively performing a high-dimensional search.

The EM cycle finds the local maximum of the likelihood that can be reached from the starting condition, but that usually is not a significant limitation because there are so many equivalent arrangements that are equally good. The Gaussians can for example be started with random means and variances large enough to "feel" the entire data set.

In EMQ we add one more complexity to the calculation. We assume that the measurement of $\vec{x}$ is quantized. For simplicity assume, $\vec{x} \notin \mathbb{R}$ is scalar so that we can simply write x. Further assume that $0 \leq x \leq 1$.

In EMQ we assume that we must place a limited number of "slicers" at positions on the number line between 0 and 1, and we can only know if x is greater than or less than the position of any given slicer. Given this limitation, we want to amend EM so that it places the slicers, receives the quantized estimates for every point $x_n$, reruns the density estimation (E and M steps) and then moves the slicers to improve its estimate of the probability distribution of actual pre-sliced points.

First, we initialize the slicers to be placed across the (0,1) interval (randomly or by some pre-determined pattern) and we initialize the mixture model to also place the gaussians across the (0,1) interval. It may be advantageous to randomize the placements of slicers and mixtures so that they are not in a degenerate initial condition that will trap the algorithm in a local minima.

Then we iterate repeatedly through 3 steps:

1) We quantize the data set using the slicers. Any actual data point that falls between two slicer points is presented to EM as if it were equidistant between these two slicer points. This means that many points that were scattered across the space, now appear to fall at a few distinct points on the interval (0,1). A more correct way to do this, that we have also implemented, is that given that the slicers tell us a range that the point falls into, we calculate in equation 1 the probability of the range given the mth Gaussian rather than the probability of a point given the mth Gaussian.

2) Then we perform ordinary E-M, first we re-estimate the moments of the mixture elements. We use the conditional probability of a gaussian given the data as the kernel against which we re-calculate its moments. Then we recalculate the conditional probability of each gaussian given the data $p(c_m|x_n)$. We might choose to iterate E-M once or more than once. After some number of E-M iterations, we have an updated Gaussian mixture modeling the distribution of the data $p(x)$.

3) Then, we update the positions of the slicers by calculating the cumulative distribution function (CDF) of our mixture model and spacing the slicers so that there is an equal amount of probability mass between each slicer. In other embodiments, there could be other methods to place the slicers based on the model's distribution. For example a less expensive but less accurate method would place the slicers around the modes of the model distribution or calculate moments that approximate the answer from the CDF method.

This is EMQ for a flash ADC using a Gaussian mixture model.

If repeating these steps over the same set of data, after the first pass it is possible to make use of the quantized information from previous passes in each successive pass. In one case, the slicer levels for each pass are common across each element of the vector. For this case, for each vector element we can retain after each step the slicer level just above and just below where the value was found (the smallest slicer point greater than the value, and the largest slicer point less than the value). On each pass, if for each vector, one or more slicer points fall between the most recently saved pair of slicer values, the saved values can be updated with new values depending on the result of these quantizations (again, saving the smallest slicer point greater than the value, and the largest slicer point less than the value). Additionally, it may be useful to, for each vector, to skip the slicer points that fall outside the previously saved values (since the slicer decisions in those cases would be known).

In an alternative implementation, after the first pass over the same set of data, the slicer used for subsequent passes could differ for each element of the vector based on the previous slicer results. This case is analogous in some sense to a SAR approach for directly quantizing individual values. In the proposed case, given the current estimate of model the model parameters and given the range of possible values for each vector value as determined by previous slicing results, the new slicer value for each vector element can be separately chosen. One method would be to base this on the CDF of the conditional distribution for the given vector element, where the conditioning is based on the results of the previous slicing operations, which narrows the value to a specific range.

Quantization Step

The choice of quantization comparator reference levels (or more generally, the parameters of a projection) depend on the posterior distribution on the new input from the model and past samples.

Given a posterior distribution, one decision rule is to choose the reference levels (parameters) to maximize the entropy of the quantization given what is already known. This amounts to a greedy scheme to maximize the information in each sample. Specifically, reference levels are chosen to evenly partition the mass in the posterior density function. Mathematically, for $N$ reference levels, they should be placed at $F_x^{-1}(1/(N+1))$, $F_x^{-1}(2/(N+1))$, ..., $F_x^{-1}(N/(N+1))$, where $F_x$ is the posterior cumulative distribution function for the analog input. Such a scheme would be best suited for Flash-type architectures where only a single quantization can be made for each analog sample.

Another scheme is detailed in the attached Appendix titled "Optimal Analog-to-Digital Conversion of Non-uniform Values" is to minimize the expected number of samples to reach a given precision. The algorithm for generating optimal reference levels under this criterion is detailed in the paper and runs in polynomial time. Such a scheme may be useful in successive-approximation (SAR) type architectures where the reference levels of a series of quantization steps on a single sample can be jointly optimized.

Generalization to More Slicers

In our code above, it would have been more correct to calculate the probability of an interval given $c_m$, rather than the probability of the point itself given $c_m$.

With a large number of slicers and small intervals between them, these two probabilities become fairly similar, but for a small number of slicers, the difference is important.

When completing the E-M-Q cycle by using the new slicer values to requantize data (Q>1 in the demo), it becomes very important to calculate the probability of an interval rather than the probability of a midpoint. This is because large gaps between slicers naturally arise in any non-uniform quantization scheme and the approximation breaks down. This problem is not as evident in a single step of EMQ.

Generalization to Soft Slicers

The soft slicer is actually already present above, and can be represented in the equations norm=$1/\sqrt{2\pi\sigma^2}$ and $p_{x|cm}(n)=$ norm.*exp$(-((x(n)-u)^2)./\sigma^2)$.

If we want, we need not have a Q step where we quantize the data. Instead, we can use an analog soft slicer circuit to directly calculate this equation from the data and output the probability to the rest of the (likely analog) Bayesian model.

Soft slicers presumably require a configuration of the entire posterior distribution to give a probability (for gaussians, only the mean and variance). The output of a soft slicer is the likelihood of analog value given the model and previous information. The soft slicer along with the inference system could be constructed entirely in analog circuitry. As an ADC, ultimately a digital result is needed but this analog system could be used to construct a set of analog values corresponding to the probabilities of various bits in a PCM coded version of the sample. Thus, only one-bit quantization on each of the PCM soft bits is needed to make a decision.

Generalize to More Dimensions

For additional samplers, in some embodiments, we use single dimensional Gaussians in high dimensions, in low dimensions use covariance matrices. In some embodiments, we perform linear projection followed by quantization, or vector quantization; which can give you significantly better performance. In the image case, you can have a block all at the same time, while in time-sequence you can't but you can do it in blocks (or moving blocks) of arbitrarily large size, which allows it to be more or less the same.

Generalization to Time-Series

For a time series of samples in some embodiments we use an HMM or HHMM or other temporal model. Data may be presented as a block sliding window, so that you perform some number of iterations of EMQ on a block and then shift.

Generalization to Non-Mixture of Gaussian

In some embodiments, the approach is based on performing an E-M iteration on histograms instead of mixtures of Gaussians. In other embodiments, the iterations are on soft-bytes and its generalizations for representation probability distributions (see, e.g., U.S. Ser. No. 12/716,155, incorporated by reference).

Generalization to Exchangeable Models

In some embodiments, we replace a time ordered model such as HHMM intended for time series data with an exchangeable model such as nested CRP, hierarchical Dirichlet, etc. intended for clustering data.

Generalization to Pipelined and Other Types of ADC

In some embodiments, the approaches described above are applied to pipelined ADCs. In some examples, the approaches are applied to pipelined approaches as described in copending application U.S. Ser. No. 13/095,188, incorporated herein by reference.

Similarly, the approaches may be applied the SAR ADC, and Sigma-Delta ADC architectures.

Generalization to "BP-Q"

EM is somethings thought of as a "poor man's" inference on a factor graph. Any problem we can solve with EM can be written as proper inference on a graph, where the parameters (moments) of the distributions are themselves first class citizen random variables. We can replace EM part of EMQ with BP (other solver) on a factor graph. (do not use M step). Factor graphs can also be solved using other solver methods (gradient descent, linear programming, MCMC, Gibbs, etc.).

Generalization to More General Adaptive Methods

In one approach, a vector of input values (e.g., a time series, a 2D image, a time series of images) would be quantized jointly instead of separately quantizing each element of the vector. On approach to such quantization is to perform a linear transformation followed by separate quantization of each of the resulting components. In some cases the linear transformation may be of low rank, such that the number of elements of the resulting vector is lower than the original number of elements. In some cases, the parameters of this transformation are determined from the model of the signal distribution. In this case, this may be a joint model over the vector, rather than a distribution over individual elements. The signal model in this case could determine both the parameters of the linear transformation applied to the signal as well as the slicer levels of the quantizer that follows this transformation. This is analogous to, but more general than compressive sensing, as it incorporates any signal model and is not limited to sparse or compressive signals.

A more general approach would be to determine the parameters of a vector quantizer based on the signal model. Such a quantizer would jointly quantize the vector, rather than having each scalar value be transformed separately. An implementation might combine vector quantization over vectors of a certain size, following a linear transformation over a vector of a larger size.

In one approach, each repetition of the quantization over the same data would project the signal to a single dimension or very small number of dimensions, and the result of this would be quantized. In this case, conditioned on the result of this quantization and on the learned model, the parameters for the next quantization would be chosen. Specifically, the basis (or subspace) on which to project, and the quantization parameters (slicer points) for this quantization. This case is a multidimensional analog to a SAR-style quantization, but where each successive step is a joint quantization over the entire vector. Again, this approach could be generalized further to use a vector quantizer at each step.

Implementation the controllable linear transformation (or linear projection) described above can make used of the switched-capacitor linear transformation methods described in copending applications U.S. Ser. Nos. 61/493,893, 12/545,590, 61/374,915, and 61/374,931.

In other implementations, these these transformations can be implemented directly in the sensing element, such as in an image sensor. In one implementation, an image sensor would include a set of capacitive elements that can be switched to either accept the charge associated with the sensor or not. The total capacitance for each element would be determined by which set of capacitive elements is included. Based on the signal model, and the resulting linear projection desired, the selection of the set of capacitive elements could be chosen to approximate the desired projection weight (and the sign, by for example selecting the polarity of a differential signal). A subset of such elements selected to form a single projection value could be combined using the charge-sharing approach described in the above-referenced applications.

Alternative Output Representations

In some implementations the desired output of an A/D converter is not simply the value of the signal at each point (in time or space). The signal model may include aspect of the physical system being observed that are not the signal values themselves. A good signal model would typically include as much of this kind of information as possible, which can often be helpful in the accuracy of the model. While this is generally useful regardless of the output of the A/D converter, in some cases the most useful output might be a subset of the estimated variables in the model, rather than the signal values themselves. For example, in an imaging system, one portion of the signal model may be the direction and magnitude of motion of the objects in the image relative to the image sensor as a function of position and time. In some cases, the output of the A/D converter may be the values of these motion flow vectors rather than the pixel intensity values. In general, for any signal model, an implementation may include the ability to output a subset of the estimated values of the variables in the model either in addition to or instead of the the signal values.

Implementations

Some implementations of the approaches are implemented in hardware, for example, in a package (e.g., integrated circuit) that accepts an analog signal and provides a digital output representing the accepted signal. The hardward can include special-purpose circuitry and/or instruction processors. The instruction processors can include a special-purpose processor, for example, adapted to perform factor-graph based computation.

It is to be understood that the foregoing description is intended to illustrate and not to limit the scope of the invention, one or more aspects of which are defined by the scope of the appended claims. Other embodiments that those described above are within the scope of the claims.

What is claimed is:

1. A signal converter comprising:
an input for accepting a time varying input analog signal;
an output for providing successive output digital values representing the input signal;

configurable signal conversion circuitry configured to accept an analog conversion signal determined from the input analog signal, and configured to convert the conversion signal to successive converted digital values which determine the successive output digital values, wherein a configuration of the signal conversion circuitry determines at least a non-uniform accuracy of conversion across values of the input signal; and a signal tracking component configured to infer one or more characteristics of the input signal and to provide a configuration to the configurable signal conversion circuitry;

wherein the signal tracking component is configured to provide a configuration to the signal conversion circuitry to provide higher accuracy for more likely values of the conversion signal.

2. The signal converter of claim 1 wherein the signal conversion circuitry comprises a plurality of comparators with thresholds set according to the configuration of the signal conversion circuitry.

3. The signal converter of claim 1 wherein the signal tracking component implements a probabilistic inference approach for inferring the characteristics of the input signal.

4. The signal converter of claim 3 wherein the signal tracking component includes circuitry adapted to implement a belief propagation approach.

5. The signal converter of claim 1 wherein the signal conversion circuitry comprises a configurable signal transformation section for accepting the analog input signal and providing the analog conversion signal.

6. The signal converter of claim 5 wherein the signal conversion circuitry further comprises a configurable digitization section for accepting the analog conversion signal and providing the converted digital values.

7. A signal converter configured to accept a sequence of analog input samples $z_t$ and provide as output a corresponding sequence of digitized values $x_t$ representing the input samples based on quantizer outputs $y_t$, the converter comprising:

first circuitry configured perform a statistical inference relating quantizer outputs $y_t$ and digitized values $x_t$ according to a model of a quantization process that generates the quantizer outputs $y_t$ from the analog input samples $z_t$;

second circuitry configured perform a statistical inference on the sequence of digitized values $x_t$ according to a model of a signal generation for the analog input samples $z_t$; and quantization circuitry for processing the analog input samples $z_t$ to produce the quantizer outputs $y_t$;

wherein the quantizer outputs $y_t$ are coupled to the second circuitry, and the first circuitry is coupled to the first circuitry such that in operation, the converter provides the sequence of digitized values $x_t$ to represent the analog input samples $z_t$ according to the model of the signal generation process.

8. The signal converter of claim 7 wherein the first circuitry and the second circuitry each implement a factor graph based inference procedure.

9. The signal converter of claim 7 wherein the quantizer outputs $y_t$ are represented with fewer bits of precision than the digitized values $x_t$.

10. The signal converter of claim 9 wherein the quantizer outputs $y_t$ are represented with one bit of precision.

11. The signal converter of claim 7 wherein the quantization circuitry comprises an adaptive quantizer configured to adapt according to characteristics of the sequence of input samples $z_t$.

12. A method for signal conversion comprising:

accepting a time varying input analog signal;

tracking the input signal, including inferring one or more characteristics of the input signal, and determining a time varying conversion configuration according to the inferred characteristics;

converting an analog conversion signal determined from the input analog signal to successive converted digital values which determine the successive output digital values, wherein the converting is performed according to the time-varying conversion configuration determined according to the inferred characteristics of the input signal; and providing the successive output digital values representing the input analog signal;

wherein the converting according to the conversion configuration provides a non-uniform accuracy of conversion across values of the input signal and provides higher accuracy for more likely values of the conversion signal.

13. A signal converter comprising:

an input for accepting a time varying input analog signal;

an output for providing successing output digital values representing the input signal;

configurable signal conversion circuitry configured to accept an analog conversion signal determined from the input analog signal, and configured to convert the conversion signal to successive converted digital values which determine the successive output digital values, wherein a configuration of the signal conversion circuitry determines at least a non-uniform accuracy of conversion across values of the input signal; and a signal tracking component configured to infer one or more characteristics of the input signal and to provide a configuration to the configurable signal conversion circuitry;

wherein the signal tracking component implements a probabilistic inference approach for inferring the characteristics of the input signal.

14. The signal converter of claim 13 wherein the signal tracking component includes circuitry adapted to implement a belief propagation approach.

* * * * *